United States Patent [19]

Lee et al.

[11] Patent Number: 5,637,524

[45] Date of Patent: Jun. 10, 1997

[54] METHOD FOR FORMING WELLS OF SEMICONDUCTOR DEVICE

[75] Inventors: Chang J. Lee; Jong K. Kim, both of Choongchungbook-Do, Rep. of Korea

[73] Assignee: LG Semicon Co., Ltd., Cheongju, Rep. of Korea

[21] Appl. No.: 582,264

[22] Filed: Jan. 3, 1996

[30] Foreign Application Priority Data

Jul. 27, 1995 [KR] Rep. of Korea ................... 22475/1995

[51] Int. Cl.[6] .................................................. H01L 21/70
[52] U.S. Cl. ........................ 438/448; 438/228; 438/451
[58] Field of Search ............................... 437/56, 26, 25, 437/69, 70, 41 RCM

[56] References Cited

U.S. PATENT DOCUMENTS

| | | | |
|---|---|---|---|
| 4,558,508 | 12/1985 | Kinney et al. | 437/41 RCM |
| 5,130,271 | 7/1992 | Migita . | |
| 5,225,365 | 7/1993 | Cosentino | 437/26 |
| 5,256,563 | 10/1993 | Moslehi et al. . | |
| 5,362,670 | 11/1994 | Iguchi et al. | 437/56 |

*Primary Examiner*—Trung Dang
*Attorney, Agent, or Firm*—Fleshner & Kim

[57] ABSTRACT

A method for forming wells of a semiconductor device, being capable of removing the topology between n- and p-well regions. The method of the present invention provides a twin well structure wherein the n-well region has a higher level than the p-well region. This method includes the steps of sequentially forming a buffering film and an oxidizable film over a semiconductor substrate, forming an anti-oxidation film over the oxidizable film, removing a portion of the anti-oxidation film disposed at a first well region of the semiconductor substrate, implanting impurity ions in the first well region of the semiconductor substrate and annealing the resulting structure, thereby forming a first well in the substrate, removing the anti-oxide film and the oxidizable film both disposed at a second well region of the substrate, and implanting impurity ions in the second well region of the semiconductor substrate and annealing the resulting structure, thereby forming a second well in the substrate.

26 Claims, 6 Drawing Sheets

MEMORY CELL AREA | PERIPHERAL CIRCUIT AREA

METHOD FOR FORMING WELLS OF SEMICONDUCTOR DEVICE

BACKGROUND OF THE INVENTION

1. Field of the Invention

The present invention relates to a method for forming wells of a semiconductor device, and more particularly to such a method capable of reducing the topology between twin wells of a highly integrated semiconductor device such as CMOS, thereby improving the wiring reliance of the semiconductor device.

2. Description of the Prior Art

In conventional CMOS twin tub structures having twin wells, a p-well region is formed in a self-aligned fashion using an oxide film, grown by an oxidation treatment upon forming an n-well region, as a mask. As result, the substrate has a topology between the p and n wells.

This will be described in detail in conjunction with a conventional method for forming wells of semiconductor devices. FIGS. 1A to 1E illustrate sequential steps of the conventional method for forming wells of a semiconductor device, respectively.

In accordance with this method, a p type silicon substrate 10 is prepared. As shown in FIG. 1A, a thermal oxide film 12 is formed over the p type silicon substrate 10 to a thickness of 100 Å. Over the thermal oxide film 12, $Si_3N_4$ is deposited to a thickness of 1,400 Å using a low pressure chemical vapor deposition (LPCVD) process in order to form a silicon nitride film 14.

Thereafter, the silicon nitride film 14 is etched at its portion corresponding to a region where an n well will be formed, using a mask which is constituted by a photoresist film pattern 16 formed on the silicon nitride film 14, thereby forming its pattern defining the n well region, as shown in FIG. 1B. Phosphorus ions are then implanted in the n well region in a density of $1.0 \times 10^{13}$ ions/cm$^2$ using energy of 120 KeV. After the ion implantation, the photoresist film pattern 16 is removed. The resulting structure is then annealed for its drive-in.

As a result, an n well 18 is formed in the silicon substrate, as shown in FIG. 1C. An oxide film 20 having a thickness of 4,500 Å fit is also formed over the n well 18.

Thereafter, the resulting structure is dipped in a hot solution of $H_3PO_4$ so as to remove the remaining silicon nitride film 14 disposed at a region where a p well will be formed, as shown in FIG. 1D. Boron ions are then implanted in the p well region in a density of $5.0 \times 10^{12}$ ions/cm$^2$ using energy of 80 KeV. The resulting structure is then annealed at a temperature of 1,150° C. for 4 hours for its drive-in. As a result, a p well 22 is formed in the silicon substrate.

Upon forming the p well 22, the oxide film 20 of 4,500 Å of disposed over the n well 18 is used as an ion implantation mask.

The resulting structure is then dipped in a solution of HF so as to remove the remaining oxide films 12 and 20, as shown in FIG. 1E. Thus, the well formation is completed. The structure is subsequently treated in accordance with the typical process for fabricating CMOS's. Since this subsequent treatment is well known, its description is omitted.

Taking into consideration the fact that the oxide film grown upon forming the n well has a thickness of about 4,000 Å, a topology d of about 2,000 Å is formed between the n well 18 and p well 22 even though the substrate is reduced in thickness by about 50% of the thickness of the grown oxide film during the oxidation treatment.

Where a photoresist film is coated over the structure having such topology to form a pattern which will be used for a subsequent processing step, it involves a variation in thickness due to the topology. The variation in thickness ranges up to 10 μm at the boundary between the wells. As a result, the pattern has a dimension varied by 0.1 μm or above after the pattern forming step.

In conventional structures, there is no problem when the variation in dimension is within 10% of the width of the pattern, that is, when the width of the pattern is at least 1.0 μm. Where the variation in dimension depending on the thickness of the photoresist film is more than 0.1 μm as semiconductor devices have a higher integration degree requiring a smaller pattern width of sub-microns less than 1.0 μM, however, there is a disadvantage that a critical circuit having a topology of less than 10 μm at the boundary of wells cannot be designed because the general design tolerance given for the semiconductor devices is more than 10%.

Such a limitation on design serves as a handicap to the fabrication of a circuit for suppressing the latch-up being problematic in highly integrated semiconductor devices. For this reason, it is difficult to obtain highly integrated semiconductor devices.

FIG. 2 illustrates a DRAM device having the above-mentioned CMOS twin well structure. As shown in FIG. 2, the DRAM device typically includes a memory cell 28 formed over the p well 22 and a peripheral drive circuit 30 formed over the n well 18. The memory cell includes an n-MOS transfer transistor 24 and a capacitor 26 in the case of the twin well structure in which the p well is formed in a self-aligned fashion using the oxide film, grown by the oxidation treatment upon forming the n well, as a mask as mentioned above.

In this structure, however, the topology between the memory cell region (including the p-well region 28) and the peripheral circuit region (including the n-well region 30) formed at the step followed by the wiring step is further increased because the capacitor 26 is additionally mounted on the p well 22 disposed at a higher level than the n well 18. Typically, the topology d' between the memory cell region 28 and the peripheral circuit region 30 is at least about 5,000 Å after the semiconductor device is completely fabricated.

Such a severe topology results in a limitation in the depth of focus used in a light exposing device upon carrying out a photolithography process for forming a wiring. As a result, a photoresist film formed for providing a wiring pattern is inaccurately etched upon forming the wiring pattern. That is, the photoresist film is not etched at its portion beyond the limited depth of focus. Due to the unnecessarily remaining portion of the photoresist film, it is difficult to obtain a desired wiring pattern. Where the wiring pattern is varied in width due to the topology, the above-mentioned phenomenon becomes more severe. As a result, the characteristic of the final semiconductor device is degraded.

In order to solve such problems, a more sophisticated method such as a modified illumination method or a multi-layered resist (MLR) method has been used which degrades the productivity, thereby making it impossible to achieve the mass production.

Meanwhile, highly integrated semiconductor devices have used a multistacked structure or cylindrical structure in place of the conventional, simple stack capacitor structure in order to obtain a capacitance equal to those of conventional structures while reducing the unit cell area. However, the use of such structures involves the above-mentioned problems because the topology between n- and p-well regions is greatly increased.

For example, in the case of 64-Mega grade DRAM devices having the cylindrical capacitor structure, it is difficult to easily perform the wiring forming step because the topology caused by the capacitor structure is too large, for example, at least 5,000 Å. Due to such a large topology, a variation in dimension occurs at the wiring pattern. This results in a stress concentration at a conduction layer formed on the structure having the large topology and a non-uniformity of the wiring pattern. As a result, there is a degradation in the reliance of the wiring.

SUMMARY OF THE INVENTION

Therefore, an object of the invention is to solve the above mentioned problems encountered in the prior art and to provide a method for forming wells of a semiconductor device having a twin well structure, being capable of reducing the topology between twin wells of a highly integrated semiconductor device such as CMOS, thereby improving the wiring reliance of the semiconductor device.

In accordance with the present invention, this object is accomplished by providing a method for forming wells of a semiconductor device, comprising the steps of: sequentially forming a buffering film and an oxidizable film over a semiconductor substrate; forming an anti-oxidation film over the oxidizable film; removing a portion of the anti-oxidation film disposed at a first well region of the semiconductor substrate; implanting impurity ions in the first well region of the semiconductor substrate and annealing the resulting structure, thereby forming a first well in the substrate; removing the anti-oxide film and the oxidizable film both disposed at a second well region of the substrate; and implanting impurity ions in the second well region of the semiconductor substrate and annealing the resulting structure, thereby forming a second well in the substrate.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Basically, the present invention solves the topology problem encountered in highly integrated semiconductors having the conventional twin well structure by forming wells having a topology opposite to those of conventional structures (that is, the p-well region is arranged at a lower level than the n-well region) so that the topology can be compensated by an additional capacitor which will be formed at the p-well region.

FIGS. 3A to 3F are sectional views respectively illustrating a method for forming wells of a semiconductor device in accordance with a first embodiment of the present invention.

Figure 1A:
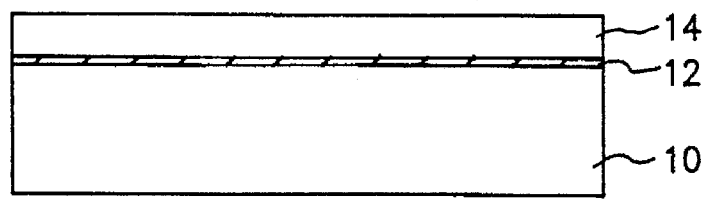
FIGS. 1A to 1E are sectional views respectively illustrating sequential steps of the conventional method for forming wells of a semiconductor device.
Figure 1B:
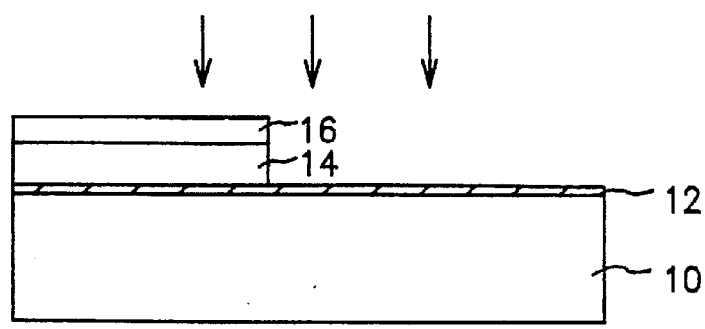
Figure 1C:
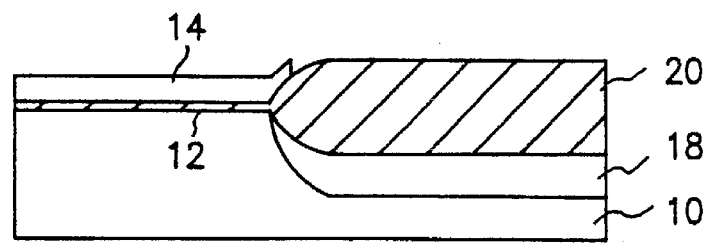
Figure 1D:
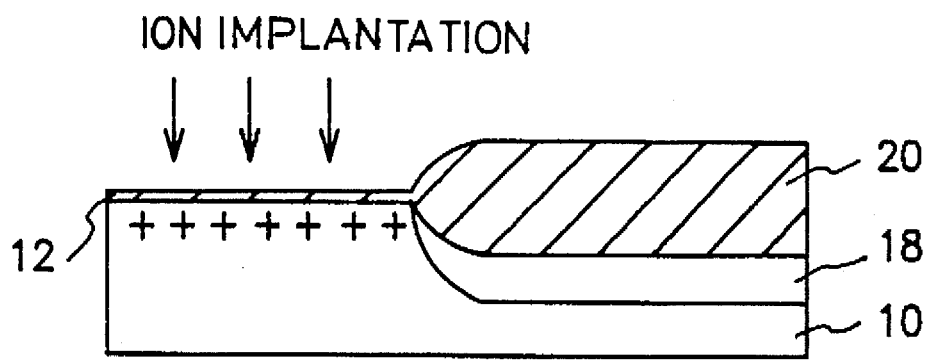
Figure 1E:
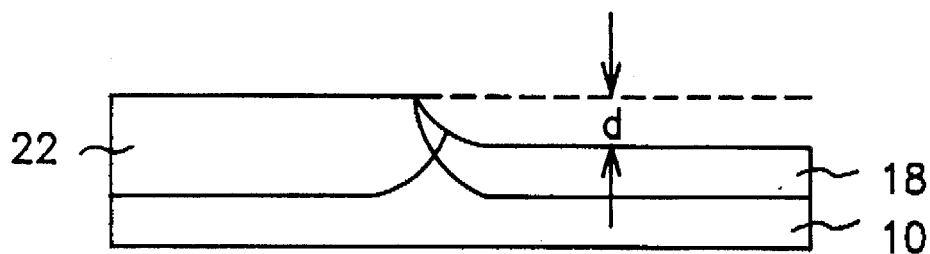
Figure 2:
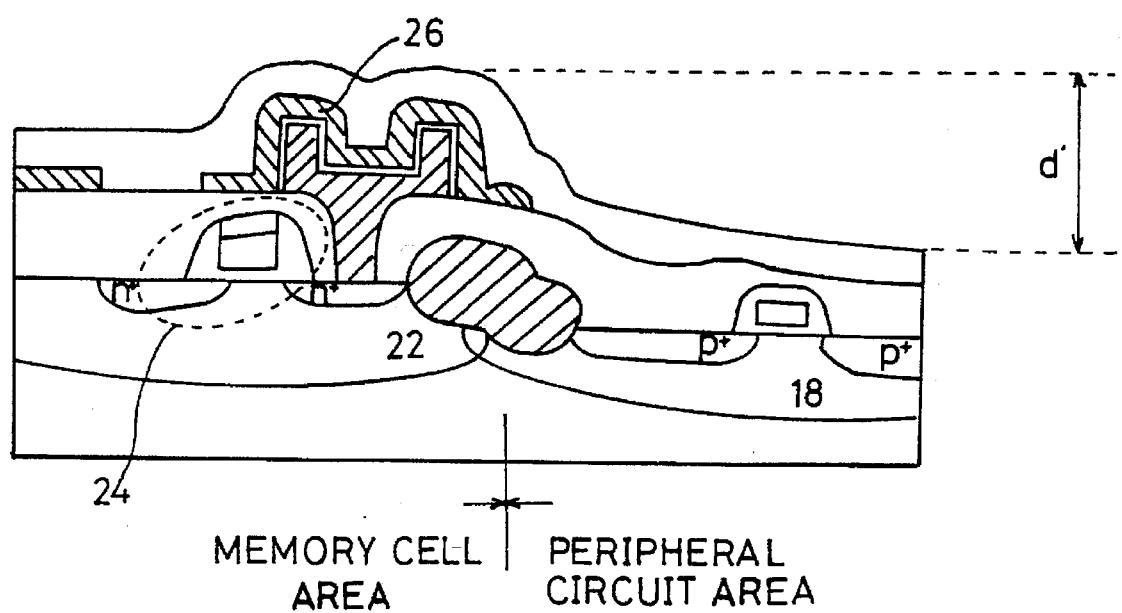
FIG. 2 is a sectional view illustrating a DRAM device having a conventional CMOS twin well structure.
Figure 3A:
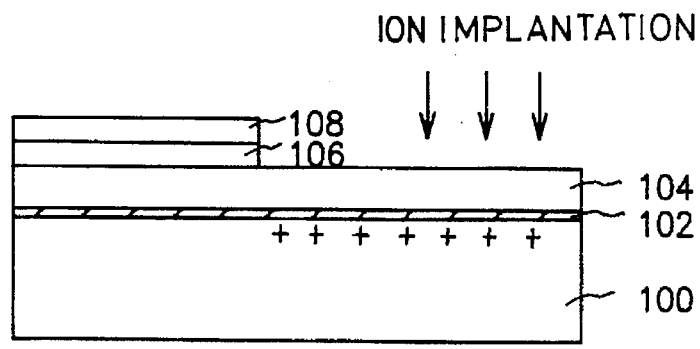
FIGS. 3A to 3F are sectional views respectively illustrating a method for forming wells of a semiconductor device in accordance with a first embodiment of the present invention.

In accordance with this method, a p type silicon substrate 100 is prepared as a semiconductor substrate. As shown in FIG. 3A, a thermal oxide film 102 is formed, as a buffering film, over the p type silicon substrate 100 to a thickness of 50 Å in accordance with the thermal oxidation method. Over the thermal oxide film 102, a polysilicon or amorphous silicon film 104 and a silicon nitride film 106 made of $Si_3N_4$ are sequentially deposited to thicknesses of 1,000 Å and 500 Å using the LPCVD process in order to form an oxidizable layer and an anti-oxidation layer, respectively. Thereafter, the silicon nitride film 106 is removed at its portion corresponding to a region where a first well will be formed in accordance with a dry etching method using the photolithography process. This dry etching is carried out using a mask which is constituted by a photoresist film pattern 108 formed on the silicon nitride film 106.

Phosphorus or arsenic ions are then implanted in the first well region of the silicon substrate 100 in a density of $1.0 \times 10^{13}$ ions/cm$^2$ using energy of 160 KeV. After the ion implantation, the resulting structure is dipped in an aqueous solution of $H_2SO_4/H_2O_2$, thereby removing the photoresist film pattern 108. The resulting structure is then annealed in a mixed gas atmosphere of $N_2/O_2$ at 1,150° C., for its drive-in.

Figure 3B:
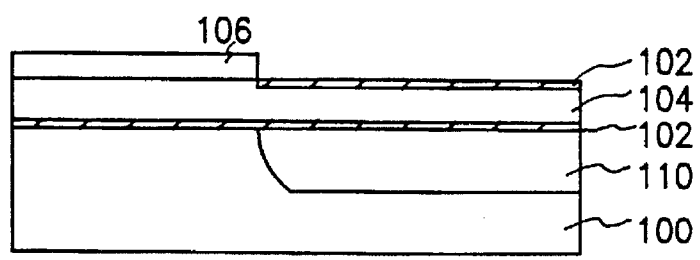

As a result, an n well 110 as the first well is formed in the silicon substrate, as shown in FIG. 3B. A thin thermal oxide film 102 is also formed over the polysilicon film 104.

Figure 3C:
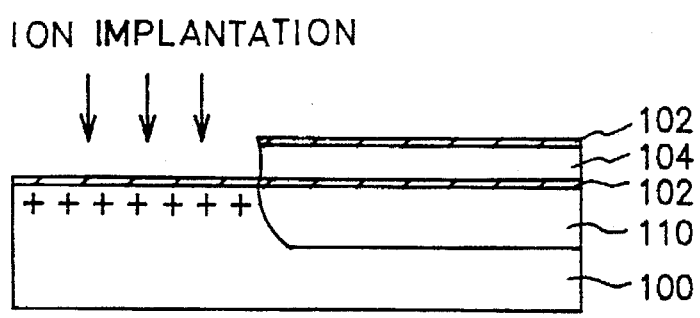
Figure 3D:
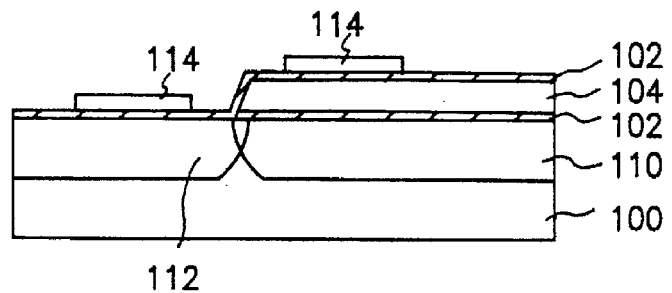

Thereafter, the resulting structure is dipped in a hot solution of $H_3PO_4$ so as to remove the remaining silicon nitride film 106 disposed at a region where a second well will be formed, as shown in FIG. 3C. The portion of polysilicon film 104 exposed at the second well region is dry etched using HBr/Cl$_2$ gas plasma. Boron ions are then implanted in the second well region in a density of $5.0 \times 10^{12}$ ions/cm$^2$ using energy of 60 KeV.

The resulting structure is then annealed at 1,150° C. for its drive-in. As a result, a p well 112 as the second well is formed in the silicon substrate. Upon forming the p well 112, an oxide film of 50 Å is grown over the thermal oxide film 102. As a result, the oxide film 102 totally has a thickness of 100 Å.

In order to treat the resulting structure by an element isolation process according to a local oxidation of silicon (LOCOS) method, a silicon nitride film 114 having a thickness of 1,400 Å is then deposited over the thermal oxide film 102. The silicon nitride film 114 is then partially removed at its portion corresponding to the field region using the photolithography process. As a result, the silicon nitride film 114 remains only at the active region.

Figure 3E:
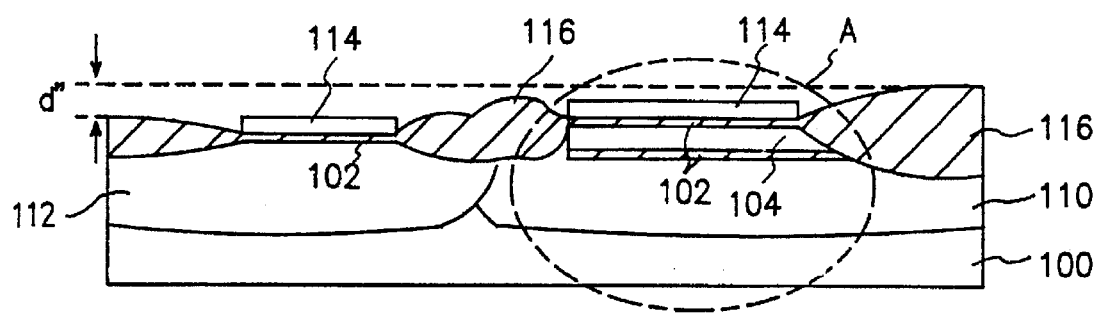

The resulting structure is then annealed at 1,000° C. in an $H_2/O_2$ atmosphere for 4 hours. By this heat treatment, the exposed silicon is oxidized, thereby growing an isolation film 116 of 5,000 Å over the field region, as shown in FIG. 3E. The resulting structure also has a polysilicon buffered element isolation structure at its region A.

Referring to FIG. 3E, it can be found that the structure has a topology d" between the cell region (namely, the p-well region) and the peripheral circuit region (namely, the n-well region) in a fashion that the peripheral circuit region is disposed at a higher level than the cell region. This topology can be compensated by a capacitor which will be subsequently formed at the cell region. Accordingly, it is possible to more advantageously carry out a subsequent wiring step in terms of the planarization.

Figure 3F:
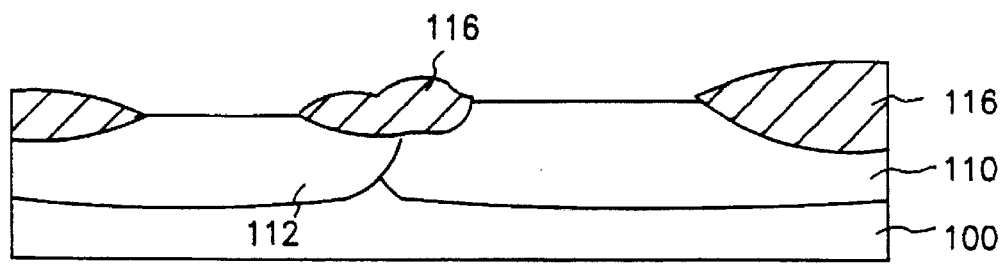

Finally, the resulting structure is dipped in a hot solution of phosphoric acid so as to remove the remaining silicon nitride film 114 disposed at the active region, as shown in FIG. 3F. Thereafter, the thermal oxide film 102 and polysilicon film 104 are sequentially removed. Thus, the well formation is completed under the condition that the element isolation has been completed. The removal of the polysilicon film 104 is achieved using the dry or wet etching method. On the other hand, the removal of the thermal oxide film 102 is achieved by dipping the thermal oxide film 102 in a solution of HF. The structure is subsequently treated in accordance with the typical process for fabricating CMOS's. Since this subsequent treatment is well known, its description is omitted.

Where isolation films 116 having the same thickness are formed on the structure fabricated in accordance with the first embodiment of the present invention, a topology opposite to that of the conventional twin well structure is obtained because the isolation film disposed at the n-well region has a higher level from the surface of the silicon substrate than the isolation film disposed at the p-well region.

Accordingly, it is possible to solve the problem occurring in DRAM cells due to the n well disposed at a lower level than the p well. In particular, it is possible to solve the problem of an increase in topology caused by the capacitor formed on the p well. This is because the n-well region is disposed at a higher level than the p-well region in accordance with the present invention.

FIGS. 4A to 4D are sectional views respectively illustrating a method for forming wells of a semiconductor device in accordance with a second embodiment of the present invention which is more or less modified from the first embodiment. In FIGS. 4A to 4D, elements respectively corresponding to those in FIGS. 3A to 3F are denoted by the same reference numerals.

Figure 4A:
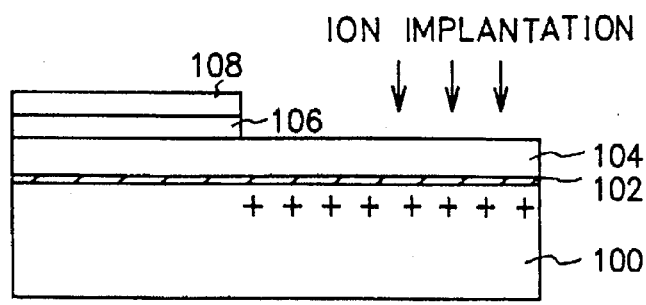
FIGS. 4A to 4D are sectional views respectively illustrating a method for forming wells of a semiconductor device in accordance with a second embodiment of the present invention.

In accordance with this method, a well forming pattern is formed, as shown in FIG. 4A, using the same method as that described in conjunction with FIG. 3A. Phosphorus or arsenic ions are then implanted in the first well region of the silicon substrate 100 in a density of $1.0 \times 10^{13}$ ions/cm² using energy of 160 KeV. After the ion implantation, the resulting structure is dipped in an aqueous solution of $H_2SO_4/H_2O_2$, thereby removing the photoresist film pattern 108.

Figure 4B:
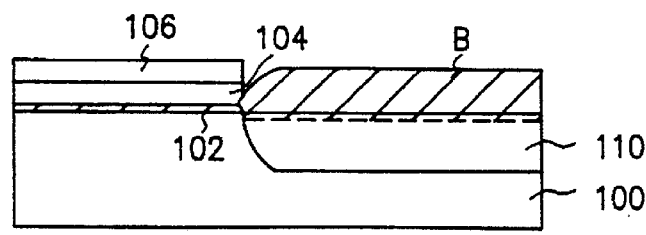

Thereafter, the resulting structure is annealed in a thermal oxidation atmosphere, thereby completely oxidizing the polysilicon film 104 to form an oxide film B, as shown in FIG. 4B. By the heat treatment, the phosphorus or arsenic ions are also diffused, thereby forming an n well 110 as the first well. The formation of the oxide film B by the heat treatment may be carried out in a fashion that only the exposed portion of the polysilicon film is oxidized. Alternatively, the formation of the oxide film B may be carried out in a fashion that the substrate is partially oxidized during the oxidation of the polysilicon film, as indicated by the dotted line in FIG. 4B.

Figure 4C:
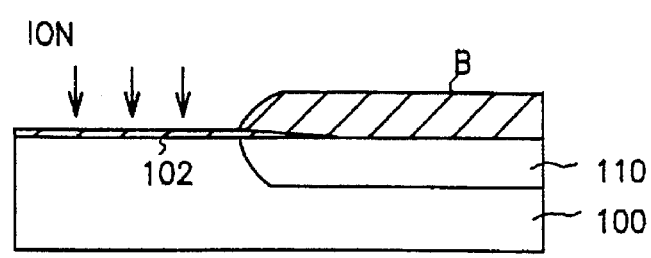

The silicon nitride film 106 and polysilicon film 104 left at the second well region are then sequentially removed, as shown in FIG. 4C. Using the oxide film B formed on the n well 110 as a mask, boron ions are then implanted in the substrate in a density of $5.0 \times 10^{12}$ ions/cm² using energy of 80 KeV.

The removal of the silicon nitride film 106 is achieved by dipping the silicon nitride film 106 in a hot solution of phosphoric acid. On the other hand, the removal of the polysilicon film 104 is achieved by dry etching the polysilicon film 104 by $HBr/Cl_2$ gas plasma.

The resulting structure is then annealed at 1.150° C., for its drive-in. As a result. a p well 112 as the second well is formed in the silicon substrate. Upon forming the p well 112, a thin thermal oxide film is grown over the thermal oxide films 102 and B.

Thereafter, the resulting structure is dipped in a solution of HF, thereby removing the thermal oxide films 102 and B respectively formed on the n and p wells 110 and 112. Thus, the well formation is completed.

Figure 4D:
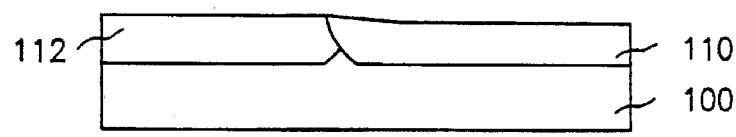

In accordance with this embodiment, a twin well structure is obtained which has no topology between the n well 110 and p well 112 or a slight topology provided in a fashion that the n-well region is disposed at a lower level than the p-well region by partially oxidizing the substrate during the oxidation of the polysilicon film 104, as shown in FIG. 4D.

As apparent from the above description, the present invention provides a method for forming wells of a semiconductor device, being capable of removing the topology between n- and p-well regions. Furthermore, the present invention provides a twin well structure wherein the n-well region has a higher level than the p-well region. In the fabrication of CMOS semiconductor devices having the twin well structure, accordingly, it is possible to prevent the wiring pattern from being varied in line width upon its formation due to the topology between n and p wells. Therefore, there is no degradation in the characteristic of the final semiconductor device. In DRAM devices, it is also possible to compensate the increased topology by the capacitor mounted on the p-well region. Accordingly, the formation of the wiring pattern for highly integrated semiconductor devices can be easily carried out. Therefore, semiconductor devices having an improved wiring reliance can be obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming wells of a semiconductor device, comprising the steps of:

sequentially forming a buffering film and an oxidizable film on a semiconductor substrate;

forming an anti-oxidation film on said oxidizable film;

removing a portion of said anti-oxidation film disposed at a first well region of said semiconductor substrate;

implanting impurity ions in said first well region of said semiconductor substrate and annealing Said resulting structure, thereby forming a first well in said semiconductor substrate;

removing said anti-oxidation film and said oxidizable film both disposed at a second well region of said semiconductor substrate; and implanting impurity ions in said second well region of said semiconductor substrate and annealing said resulting structure, thereby forming a second well in said semiconductor substrate;

forming a mask pattern at an active region of said semiconductor substrate;

forming an isolation film at a field region of said semiconductor substrate in accordance with an annealing process using said mask pattern; and removing said mask pattern, said oxidizable film and said buffering film all disposed at said active region.

2. The method in accordance with claim 1, wherein said first well is formed by diffusing n type impurity ions.

3. The method in accordance with claim 1, wherein said second well is formed by diffusing p type impurity ions.

4. The method in accordance with claim 1, wherein said annealing step for forming said second well and said isolation film are carried out in an atmosphere containing traces of oxygen.

5. The method in accordance with claim 1, wherein said oxidizable film is made of polysilicon or amorphous silicon.

6. The method in accordance with claim 2, wherein said n type impurity ions implanted for forming said first well are phosphorous ions or arsenic ions.

7. The method in accordance with claim 1, wherein said step of removing said oxidizable film is carried out by a dry etching using $HBr/Cl_2$ gas plasma.

8. The method in accordance with claim 1, wherein a thin oxide film is formed in said oxidizable film by means of said annealing for forming said first well.

9. The method in accordance with claim 1, wherein said mask pattern is comprised of a silicon nitride film.

10. The method in accordance with claim 1, wherein said oxidizable film is completely oxidized by means of said annealing for forming the first well.

11. The method in accordance with said claim 10, wherein said first well is formed simultaneously with said oxidation of said oxidizable film during said annealing step.

12. The method in accordance with claim 10, wherein said semiconductor substrate is partially oxidized along with said oxidizable film by means of said annealing for forming said first well.

13. The method in accordance with claim 3, wherein said p type impurity ions implanted for forming said second well are boron ions.

14. A method for forming a twin well structure, comprising the steps of:

a) sequentially forming a buffering film and an oxidizable film on a semiconductor substrate, b) forming an anti-oxidation film on said oxidizable film, c) forming a first well region of a first conductivity type in a semiconductor substrate, the step for forming said first well region including the steps of
 i) removing a portion of said anti-oxidation film disposed at a first area of said semiconductor substrate, and
 ii) doping said first area of said semiconductor substrate with first dopants of said first conductivity type to form said first well region;

d) forming a second well region of a second conductivity type in said semiconductor substrate; and e) forming an isolation film at a field region of said semiconductor substrate, wherein said step (e) is performed after said steps (c) and (d).

15. The method of claim 14, wherein said step of doping said first area to form said first well region comprises:

ion implanting said first dopants into said first area of said semiconductor substrate; and
 annealing said semiconductor substrate.

16. The method of claim 14, wherein said step of forming said second well region comprises the steps of:

removing said anti-oxidation film and said oxidizable film disposed on a second area of said semiconductor substrate; and
 doping said second area of said semiconductor substrate with second dopants of said second conductivity type to form said second well region.

17. The method of claim 16, wherein said step of doping said second area comprises:

ion implanting said second dopants into said second area of said semiconductor chip; and annealing said semiconductor substrate.

18. The method of claim 14, wherein said step of forming said isolation film comprises:

forming a mask pattern at an active region of said semiconductor substrate; and
 annealing said semiconductor substrate to form said isolation film.

19. The method of claim 18, further comprising the step of removing said mask pattern, said oxidizable film and said buffering film disposed at said active region.

20. The method of claim 15, wherein said oxidizable film is completely oxidized during said annealing step for forming said first well region.

21. The method of claim 15, wherein said semiconductor substrate is partially oxidized along with said oxidizable film during said annealing step for forming said first well region.

22. The method of claim 16, wherein said first dopants are at least one of phosphorous ions and arsenic ions, and said second dopants are boron ions.

23. A method for forming a twin well structure, comprising the steps of:

a) sequentially forming a buffering film and an oxidizable film on a semiconductor substrate, b) forming an anti-oxidation film on said oxidizable film, c) removing a portion of said anti-oxidation film disposed at a first area of said semiconductor substrate, and d) ion implanting said first area of said semiconductor substrate with first dopants of a first conductivity type;

(e) annealing said oxidizable film at said first area of said semiconductor substrate to form an oxide film, whereby a first well region of said first conductivity type is formed at said first area doped with said first dopants; and (f) doping a second area of said semiconductor substrate to form a second well region, wherein said steps (a)–(f) are performed prior to formation of an isolation film between said first and second well regions.

24. The method of claim 23, wherein said step of doping said second area to form said second well region comprises the steps of:

removing said anti-oxidation film and said oxidizable film at said second area of said semiconductor substrate;
 ion implanting said second dopants into said second area of said semiconductor substrate; and
 annealing said semiconductor substrate.

25. The method of claim 24, further comprising the step of removing said buffering film and said oxide film of said semiconductor substrate.

26. The method of claim 24, wherein said first dopants are at least one of phosphorous ions and arsenic ions, and said second dopants are boron ions.

* * * * *